(12) United States Patent
Turski et al.

(10) Patent No.: US 6,600,307 B2
(45) Date of Patent: Jul. 29, 2003

(54) METHOD AND APPARATUS FOR MEASURING TRUE TRANSMITTED POWER USING A BROADBAND DUAL DIRECTIONAL COUPLER

(75) Inventors: Zygmond Turski, Florence, NJ (US); Bernard Dov Geller, Morrisville, NC (US)

(73) Assignee: Sarnoff Corporation, Princeton, NJ (US)

( * ) Notice: Subject to any disclaimer, the term of this patent is extended or adjusted under 35 U.S.C. 154(b) by 174 days.

(21) Appl. No.: 09/742,768

(22) Filed: Dec. 21, 2000

(65) Prior Publication Data

US 2001/0048311 A1 Dec. 6, 2001

Related U.S. Application Data

(60) Provisional application No. 60/186,546, filed on Mar. 2, 2000.

(51) Int. Cl.[7] .............................................. G01R 25/02
(52) U.S. Cl. ...................................... 324/95; 324/158.1
(58) Field of Search ......................... 324/95, 94, 501, 324/51, 432; 333/17.3, 32; 455/125, 121, 123

(56) References Cited

U.S. PATENT DOCUMENTS

| | | | | |
|---|---|---|---|---|
| 3,789,301 A | | 1/1974 | Malaviya ................. 324/158 T |
| 4,002,975 A | * | 1/1977 | Erickson et al. ............. 324/501 |
| 4,122,400 A | | 10/1978 | Medendorp et al. ...... 330/207 P |
| 4,547,746 A | | 10/1985 | Erickson et al. ............. 330/298 |
| 5,038,112 A | | 8/1991 | O'Neill ................... 330/207 P |
| 5,049,816 A | | 9/1991 | Moslehi ................... 324/158 D |
| 5,300,068 A | | 4/1994 | Rosar et al. ................... 606/34 |
| 5,307,237 A | * | 4/1994 | Walz ........................... 174/252 |
| 5,486,914 A | * | 1/1996 | Denove et al. .............. 352/141 |
| 5,530,923 A | | 6/1996 | Heinonen et al. ............ 455/126 |
| 5,689,217 A | * | 11/1997 | Gu et al. ...................... 333/116 |
| 6,064,758 A | * | 5/2000 | Jin ................................ 29/739 |
| 6,147,502 A | | 11/2000 | Fryer et al. .................. 324/637 |
| 6,212,431 B1 | * | 4/2001 | Hahn et al. ..................... 607/61 |
| 6,329,880 B2 | | 12/2001 | Akiya ........................ 330/298 |

OTHER PUBLICATIONS

PCT Written Opinion, PCT/US01/05637, Date of Mailing Apr. 2, 2002.

* cited by examiner

*Primary Examiner*—Kamand Cuneo
*Assistant Examiner*—Tung X. Nguyen
(74) *Attorney, Agent, or Firm*—William J. Burke

(57) ABSTRACT

A dual-directional coupler for measuring true RF power apparent at a radiating element. Incident and reflected power are detected by a pair of detectors. The difference between the two detected voltages is amplified by a differential amplifier to generate a voltage proportional to the true transmitted power.

18 Claims, 2 Drawing Sheets

METHOD AND APPARATUS FOR MEASURING TRUE TRANSMITTED POWER USING A BROADBAND DUAL DIRECTIONAL COUPLER

This application claims the benefit of U.S. Provisional Application No. 60/186,546 filed Mar. 2, 2000, which is herein incorporated by reference.

FIELD OF THE INVENTION

This invention relates to radio frequency directional couplers and, more particularly, to a dual directional coupler that generates a true transmitted power measurement.

DESCRIPTION OF THE BACKGROUND ART

The performance of cellular telephony and similar duplex wireless communications systems depend strongly on dynamic control of the power transmitted by each base station and each portable terminal. The Federal Communications Commission (FCC), to keep power levels within a safe level, mandates precise control of the power transmitted from the portable terminal.

Prior art methods of measuring transmitted power in a portable terminal use a directional coupler to only sample the incident power at the radiating element. A radiating element may not be perfectly matched to the characteristic impedance of the feedline and a radiating element's impedance characteristics change as the portable terminal changes its location and proximity to other objects. Also, if the antenna were to be disconnected, the power to the antenna would be measured as being correct even though no power was transmitted. Therefore, it cannot be assumed that the transmitted power be derived with any degree of accuracy from the measured incident power alone.

The present invention overcomes the deficiencies found in the prior art and satisfies the need for a device that can provide an accurate measurement of true transmitted power at the radiating element within a small footprint and a low cost mandated by portable terminals.

SUMMARY OF THE INVENTION

The present invention is a dual-directional coupler comprising two detector circuits that generate voltages proportional to the incident power and reflected power. The voltages from the detector circuits are coupled to a differential amplifier. The differential amplifier generates a voltage proportional to the difference between the incident power and reflected power that represents the true transmitted power at the radiating element. The dual-directional coupler is fabricated on a ceramic substrate to facilitate a compact, surface mount implementation. Such a compact coupler can be easily installed in a cellular telephone.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
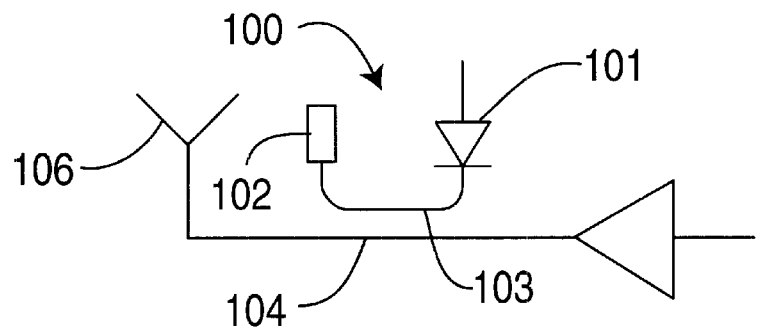
FIG. 1 depicts a schematic diagram of a prior art directional coupler.

FIG. 1 shows a schematic diagram of a prior art directional coupler 100 comprising a detector 101, a terminal impedance 102, a tuned length coupling section 103 and a radio frequency (RF) feed-line 104 placed in close proximity to the coupling section 103. When RF energy is directly coupled into the feed-line 104, a small amount of energy is coupled into the tuned coupling section 103. The detector 101 detects RF energy in the coupling section and produces an output voltage proportional to RF energy in the feed-line 104. The prior art directional coupler circuit only samples incident power present at the radiating element and does not detect any probable reflected power loss due to impedance mismatch at a radiating element 106, the reflected power being dissipated in the terminating resistance 102.

Figure 2:
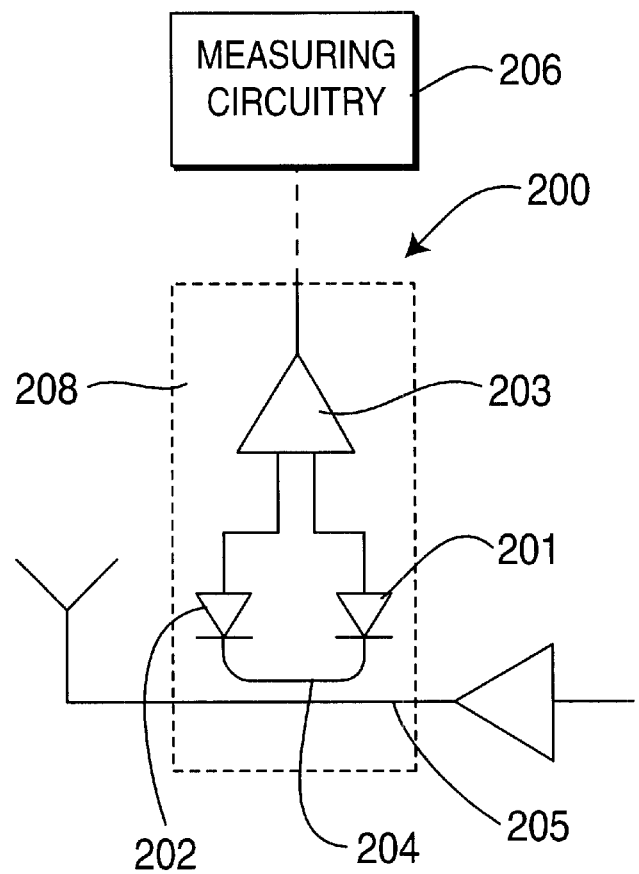
FIG. 2 shows a schematic diagram of a dual-directional coupler in accordance with the invention.

FIG. 2 shows a schematic diagram of dual directional coupler 200 in accordance with the invention. Dual directional coupler 200 comprises a first detector 201 (e.g., an RF diode) having an anode and cathode terminal, a second detector 202 (e.g., an RF diode) having an anode and cathode terminal, a differential amplifier 203 having a first input terminal coupled to the anode of the first detector 201, a second input terminal coupled to the anode of the second detector 203 and an output terminal, a tuned length coupling section 204 having an input terminal coupled to the cathode of the first detector 201 and an output terminal coupled to the cathode of the second detector 202, and an RF feed-line section 205 having an input and output terminal placed in close proximity to the coupling section 204. The coupling section 204 and feedline section 205 are striplines that are mounted on a substrate 208. The output terminal of the differential amplifier 203 may be connected to analog or digital voltage measuring circuits 206 known in the art. These circuits may comprise an analog to digital converter (ADC) for producing a digital word representing the true transmittal RF power. The ADC may or may not be affixed to the coupler substrate 208.

The dual-directional coupler 200, with directivity D, provides separation between the incident power Pi present at the input terminal of the coupling section 204 and the reflected power Pr present at the output of the coupling section 204. Disregarding device losses, the transmitted power can be represented as:

$$P_t = P_i - P_r$$

For directivity D<<1, and adding coupling variable C, the transmitted power can be represented as:

$$P_t = (1/C)(P'_i - P'_r)$$

First and second detector units operate in the square law region such that the output voltages are linearly proportional to $P_i$ and $P_r$.

Figure 3:
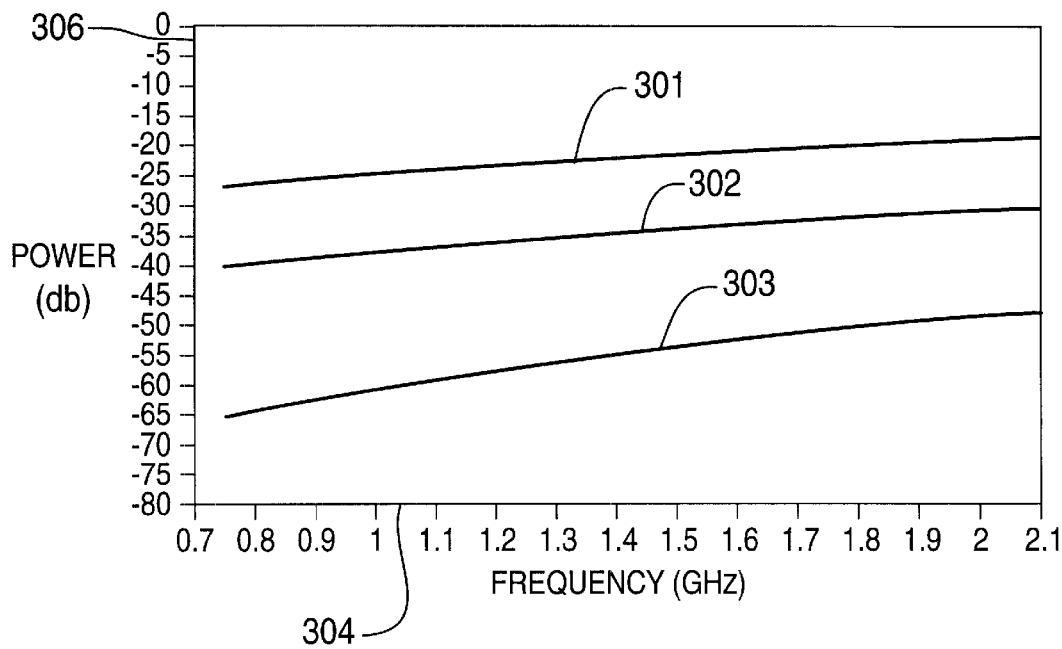
FIG. 3 shows a performance graph of the tuned coupler section.

FIG. 3 shows a graph plotting frequency (axis 304) versus power (axis 306) of tuned coupling section 204. Coupling performance shown in the upper trace 301 of the graph indicates the amount of RF power sampled from the RF feedline 205. Return loss performance shown in the middle trace 302 of the graph is a measure of how well the coupler is matched to a 50 ohm system. Isolation performance shown in the bottom trace 303 of the graph indicates the magnitude of the undesired signal present at each coupled port.

It is desirable to construct a tuned coupling section 204 to have a flat impedance response across the 850 MHz Cellular and 1.9 GHz PCS mobile telephony bands. It is also desirable for the tuned coupling section 204 to have approximately −20 db of coupling throughout the desired frequency range. To achieve the foregoing with a desired coupling section length of 0.22 cm and a desired electrical length of 13.1°, it is determined through mathematical expressions well known in the art that even and odd mode impedances of a 7.7 db coupler are required. In one embodiment, with a groundplane spacing of 1.36 mm, the tuned coupling section 204 has a width of 0.30 mm and a spacing of 0.30 mm from the RF feed-line 205 and a ceramic substrate. The ceramic substrate can be manufactured using a low temperature ceramic circuit (LTCC) technique to achieve a tailored dielectric constant. This implementation produces a dual-directional coupler in a ceramic package that is approximately 100 mils×100 mils. Such a small package enables the coupler to be used in cellular telephones and other small electronic applications.

In operation, RF power is applied to the input terminal of the RF feed-line 205. A small amount of RF power is induced into the tuned coupling section 204. The first detector 201 detects incident power present and couples a proportional voltage to the first input of the differential amplifier 203. The second detector 202 detects reflected power present and couples a proportional voltage to the second input of the differential amplifier 203. The differential amplifier 203 algebraically combines voltages from the first and second inputs and produces a voltage proportional to the actual power present at the radiating element. In some applications, the analog output from the detectors 201 and 202 may be used without the differential amplifier 203. A further application may couple the sampled RF to circuitry that is not on the coupler's substrate.

Figure 4:
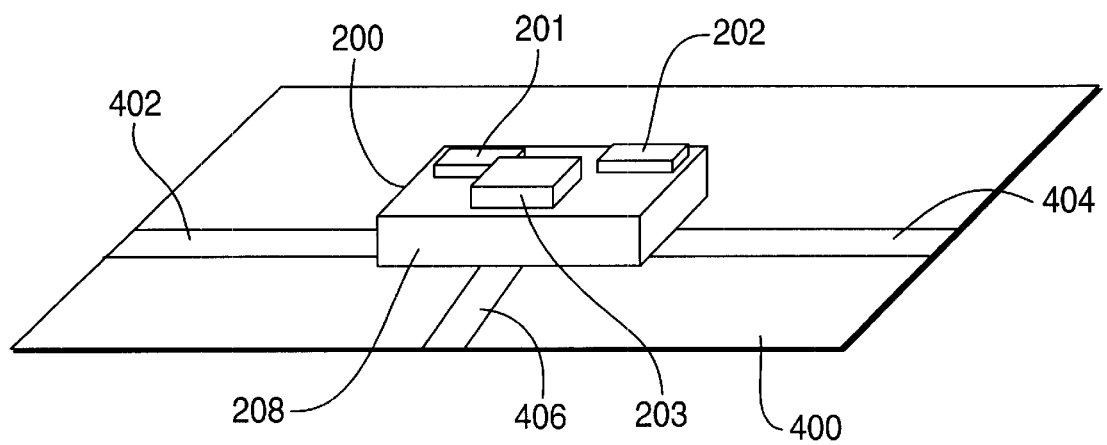
FIG. 4 shows a perspective view of a dual-directional coupler contained in a surface mount device in accordance with the invention.

FIG. 4 depicts a perspective view of one embodiment of the invention. Due to the substantial limitations on the use of printed circuit boards (PCB) surface area in such mobile devices as cellular telephones, the invention is implemented using a printed/hybrid implementation. This implementation is selected to enable the device to operate in both the cellular and PCS bands simultaneously while maintaining a low profile of less than 2.54×2.54×3 mm in a surface mount package (module). In the depicted embodiment, the coupler 200 is surface mounted to PCB 400. Circuit traces 402, 404, and 406 carry input RF, output RF an detected signals, respectively. The detectors 201 and 202 and the differential amplifier 203 are mounted to the top of the coupler 200.

Although various embodiments which incorporate the teachings of the present invention have been shown and described in detail herein, those skilled in the art can readily devise many other varied embodiments that still incorporate these teachings.

What is claimed is:

1. An apparatus for generating an output signal representative of a true transmitted power at a radiating element coupled to an RF feed line, comprising:

an RF coupling section, formed on a substrate proximate the RF feed line, for coupling RF power incident at the radiating element and RF power reflected at the radiating element;

a first detector, mounted to the substrate and coupled to the RF coupling section, for providing a first voltage representative of the RF power incident at the radiating element;

a second detector, mounted to the substrate and coupled to the RF coupling section, for providing a second voltage representative of the RF power reflected at the radiating element; and a differential amplifier, mounted to the substrate and coupled to the first detector and the second detector, for combining the first voltage and the second voltage to provide an output signal indicative of a true transmitted power at the radiating element.

2. The apparatus of claim 1 wherein said RF coupling section has a length of 0.22 cm.

3. The apparatus claim 1 wherein said RF coupling section has a width of 0.30 mm.

4. The apparatus of claim 1 wherein said RF coupling section has a parallel spacing of 0.30 mm from said RF feed line.

5. The apparatus of claim 1 further comprising an analog to digital converter coupled to the differential amplifier to generate a digital word representing the a true transmitted power at the radiating element.

6. The apparatus of claim 1 wherein the RF feed line comprises a stripline mounted on a printed circuit board and the substrate is mounted to the printed circuit board proximate the stripline.

7. The apparatus of claim 6 wherein said substrate has a length of less than 2.5 mm and a width of less than 2.5 mm.

8. The apparatus of claim 6 wherein said substrate is a surface mount device.

9. The apparatus of claim 6, wherein the substrate is a ceramic substrate.

10. The apparatus of claim 1, wherein the RF coupling section has a length adapted to couple an RF signal having a frequency of 850 MHz and an RF signal having a frequency of 1.9 GHz.

11. In a cellular telephone having a radiating element coupled to an RF feed line mounted to a printed circuit board, a dual-directional coupler comprising:

a substrate mounted to the printed circuit board proximate the RF feed line;

a coupling section, attached to said substrate, and positioned parallel to said RF feed line, for coupling RF power incident at the radiating element and RE power reflected at the radiating element from the RF feed line; and a differential amplifier coupled to the coupling section for combining the RF power incident at the radiating element and the RF power reflected at the radiating element to provide an output signal indicative of a true transmitted power at the radiating element.

12. The dual-directional coupler of claim 11 wherein said substrate is ceramic.

13. The dual-directional coupler of claim 11 wherein said coupling section has a length of 0.22 cm.

14. The dual-directional coupler of claim 11 wherein said coupling section has a width of 0.33 mm.

15. The dual-directional coupler of claim 11 wherein said coupling section has a parallel spacing of 0.30 mm from said RF feed line.

16. The dual-directional coupler of claim 11 further comprising:

a first detector coupled to a first end of said coupling section; and a second detector coupled to a second end of said coupling section.

17. The dual-directional coupler of claim 12, wherein said substrate has a length and width of less than 2.5 mm by 2.5 mm.

18. The dual-directional coupler of claim 11, wherein the coupling section has a length adapted to couple an RF signal having a frequency of 850 MHz and an RF signal having a frequency of 1.9 GHz.

* * * * *